(12) United States Patent
Boudreaux (10) Patent No.: US 9,941,567 B2
(45) Date of Patent: Apr. 10, 2018

(54) INTEGRATED PCB INTERCONNECT SYSTEM

(71) Applicant: L-3 Communications Corporation, New York, NY (US)

(72) Inventor: Brent A. Boudreaux, Denton, TX (US)

(73) Assignee: L-3 Communications Corporation, New York, NY (US)

( * ) Notice: Subject to any disclaimer, the term of this patent is extended or adjusted under 35 U.S.C. 154(b) by 0 days.

(21) Appl. No.: 14/962,783

(22) Filed: Dec. 8, 2015

(65) Prior Publication Data
US 2017/0019997 A1 Jan. 19, 2017

Related U.S. Application Data

(60) Provisional application No. 62/193,337, filed on Jul. 16, 2015.

(51) Int. Cl.
*H05K 1/11* (2006.01)
*H01P 3/00* (2006.01)
(Continued)

(52) U.S. Cl.
CPC .............. *H01P 3/003* (2013.01); *H05K 3/366* (2013.01); *H01R 12/737* (2013.01); *H05K 1/117* (2013.01);
(Continued)

(58) Field of Classification Search
CPC .......... H05K 1/14; H05K 1/141; H05K 1/117; H05K 2201/1034; H05K 5/0291; H01R 23/68; H01R 12/737
(Continued)

(56) References Cited

U.S. PATENT DOCUMENTS

| 4,818,240 A * | 4/1989 | Karner ................... H05K 1/141 439/377 |
| 5,635,758 A * | 6/1997 | Drekmeier ........... H01R 12/585 257/690 |
| 2012/0262862 A1* | 10/2012 | Johnson .................... G06F 1/32 361/679.02 |

OTHER PUBLICATIONS

ISI Interconnect Systems, Inc., "ISI Space-Saving HiLo Connector Developed to Mate Two Miniature Parallel Boards" Solution Brief, Describes products publicly known prior to the Jul. 16, 2015 filing date of U.S. Appl. No. 62/193,337 to which the current patent application claims benefit, 2 pgs.
(Continued)

*Primary Examiner* — Binh Tran
(74) *Attorney, Agent, or Firm* — Egan Peterman Enders Huston (57) ABSTRACT

An electronic assembly and device are provided. The electronic assembly includes a first circuit board, with PCB pads located adjacent to an edge of the circuit board, and a corresponding plurality of contacts, each contact soldered to one of the PCB pads. Each contact has a first portion, soldered to the PCB pad, and a second portion that extends past the edge of the circuit board and forms a leaf spring. The leaf spring compresses when placed in contact with a PCB pad of a second circuit board, where the PCB pad is substantially coplanar with a surface of the second circuit board. A restoring force of the second portion maintains contact between the second portion and the PCB pad of the second circuit board. The contact forms an electrical connection between the PCB pad of the first circuit board and the PCB pad of the second circuit board.

25 Claims, 6 Drawing Sheets

(51) Int. Cl.
- *H05K 3/36* (2006.01)
- *H05K 1/14* (2006.01)
- *H05K 7/14* (2006.01)
- *H01R 13/66* (2006.01)
- *H01R 13/648* (2006.01)
- *H05K 5/02* (2006.01)
- *H01R 12/73* (2011.01)

(52) U.S. Cl.
CPC ............... *H05K 1/14* (2013.01); *H05K 1/141* (2013.01); *H05K 5/0291* (2013.01); *H05K 2201/0311* (2013.01); *H05K 2201/1034* (2013.01)

(58) Field of Classification Search
USPC ............... 361/784, 785, 787, 791, 796, 803; 439/541.5, 607.11, 607.32
See application file for complete search history.

(56) References Cited

OTHER PUBLICATIONS

ISI Interconnect Systems, Inc., "HiLo Interconnect", Oct. 2012, 22 pgs.
Spring Loaded Connectors (SLC's), Obtained From Internet Nov. 23, 2015, 6 pgs.
Mill-Max, Spring Loaded Pins, Discrete Spring Loaded Contacts, Surface Mount, Describes products publicly known prior to the Jul. 16, 2015 filing date of U.S. Appl. No. 62/193,337 to which the current patent application claims benefit, 6 pgs.
TE Connectivity, "Quick Reference Guide, Compressive Board to Board Connectors", 2014, 4 pgs.
TE Connectivity, "Spring Fingers", Consumer Devices, 2014, 6 pgs.
Interconnect Systems, Inc., "HiLo Interconnect", Describes products publicly known prior to the Jul. 16, 2015 filing date of U.S. Appl. No. 62/193,337 to which the current patent application claims benefit, 2 pgs.

* cited by examiner

INTEGRATED PCB INTERCONNECT SYSTEM

CROSS-REFERENCE TO RELATED APPLICATIONS AND CLAIM OF PRIORITY

The present application is related to U.S. Provisional Patent Application No. 62/193,337, filed Jul. 16, 2015, entitled "INTEGRATED PCB INTERCONNECT." Provisional Patent Application No. 62/193,337 is assigned to the assignee of the present application and is hereby incorporated by reference into the present application as if fully set forth herein. The present application hereby claims priority under 35 U.S.C. § 119(e) to U.S. Provisional Patent Application No. 62/193,337.

TECHNICAL FIELD

The present application relates generally to electronic assemblies and, more specifically, to an integrated printed-circuit board (PCB) interconnect system.

BACKGROUND

As electronic assemblies have shrunk into ever-smaller packages, electronics density has increased and overall board size has decreased. Electronic assemblies often comprise a plurality of PCBs that must be electrically interconnected. Along with components and assemblies, PCB interconnects have had to shrink to smaller footprints and increased densities. In the case of very small PCBs, the components that provide this electrical interconnection between boards can occupy much of the available space on the PCB.

Typically, interconnection components are configured as one or more rows of equal-spaced (regular pitch) connector pins. Such interconnection components are often configured in two parts. A first part includes a header that provides mechanical support for pins that extend from the header. A second part includes a receptacle with a plurality of mating connector sockets into which the pins are received.

The header is located in a rectangular area of a first PCB, with back ends of the pins soldered into holes in the first PCB. Similarly, the receptacle is located in a rectangular area of a second PCB, with back ends of the connector sockets soldered into holes in the second PCB. Positioning of the header and the receptacle on the first and second PCBs, respectively, is typically determined by physical requirements for locating the first and second PCBs within the electronic assembly. Once the header and receptacle are positioned on their respective PCBs, PCB traces must then be routed to connect the pins and sockets to whatever electronic components they are connected to.

SUMMARY

In a first embodiment, an electronic assembly includes a first circuit board, having a plurality of PCB pads located adjacent to one or more edges of the first circuit board. The assembly further includes a corresponding plurality of contacts, each contact soldered to a PCB pad of the first circuit board. Each contact has a first portion that is configured to be soldered to the associated PCB pad and a second portion configured to extend past the adjacent edge of the circuit board and form a leaf spring. The leaf spring is configured to compress when placed in contact with a PCB pad of a second circuit board, where the PCB pad of the second circuit board is substantially coplanar with a surface of the second circuit board. A restoring force of the second portion is configured to maintain contact between the second portion and the PCB pad of the second circuit board. The contact forms an electrical connection between the PCB pad of the first circuit board and the PCB pad of the second circuit board.

In a second embodiment, an electronic device includes a plurality of circuit boards and a motherboard. Each circuit board includes a plurality of PCB pads located adjacent to one or more edges of the circuit board and a corresponding plurality of contacts, each contact soldered to an associated PCB pad of the circuit board. The motherboard is configured to connect electrically to the plurality of circuit boards. Each contact includes a first portion configured to be soldered to the associated PCB pad and a second portion configured to extend past the adjacent edge of the associated circuit board and form a leaf spring. The leaf spring is configured to compress when placed in contact with a PCB pad of the motherboard, where the PCB pad of the motherboard is substantially coplanar with a surface of the motherboard. A restoring force of the second portion is configured to maintain contact between the second portion and the PCB pad of the motherboard. The contact forms an electrical connection between the PCB pad of the associated circuit board and the PCB pad of the motherboard.

In a third embodiment, an electronic assembly includes a first circuit board, including a plurality of PCB pads, and a corresponding plurality of contacts, each contact soldered to an associated PCB pad of the first circuit board. Each contact comprises a first portion configured to be soldered to the associated PCB pad of the first circuit board and a second portion configured to extend away from the circuit board in a direction normal to the associated PCB pad. The second portion forms a leaf spring configured to compress when placed in contact with a PCB pad of a second circuit board, where the PCB pad of the second circuit board is substantially coplanar with a surface of the second circuit board. A restoring force of the second portion is configured to maintain contact between the second portion and the PCB pad of the second circuit board. The contact forms an electrical connection between the PCB pad of the first circuit board and the PCB pad of the second circuit board.

In a fourth embodiment, an electronic device includes a first circuit board, a second circuit board, and a motherboard. The first circuit board includes a first plurality of PCB pads and a corresponding plurality of lap joint contacts, each lap joint contact soldered to an associated PCB pad of the first plurality of PCB pads. The first circuit board further includes a second plurality of PCB pads located adjacent to an edge of the first circuit board and a corresponding plurality of edge contacts, each edge contact soldered to an associated PCB pad of the second plurality of PCB pads. The second circuit board, includes a third plurality of PCB pads. The motherboard includes a fourth plurality of PCB pads.

Each lap joint contact includes a first portion configured to be soldered to the associated PCB pad of the first plurality of PCB pads and a second portion configured to extend away from the first circuit board in a direction normal to the associated PCB pad and form a leaf spring. The leaf spring is configured to compress when placed in contact with a PCB pad of the third plurality of PCB pads, where the PCB pad of the third plurality of PCB pads is substantially coplanar with a surface of the second circuit board. A restoring force of the second portion of the lap joint contacts is configured to maintain contact between the second portion and the PCB pad of the third plurality of PCB pads. The lap joint contact forms an electrical connection between the PCB pad of the first plurality of PCB pads and the PCB pad of the third plurality of PCB pads.

Each edge contact includes a first portion configured to be soldered to the associated PCB pad of the second plurality of PCB pads and a second portion configured to extend past the adjacent edge of the first circuit board and form a leaf spring. The leaf spring is configured to compress when placed in contact with a PCB pad of the fourth plurality of PCB pads, where the PCB pad of the fourth plurality of PCB pads is substantially coplanar with a surface of the motherboard. A restoring force of the second portion is configured to maintain contact between the second portion and the PCB pad of the fourth plurality of PCB pads. The contact forms an electrical connection between the PCB pad of the second plurality of PCB pads and the PCB pad of the fourth plurality of PCB pads Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 7A, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged integrated PCB interconnect system.

A PCB electrical interconnect system according to the disclosure integrates a contact into the PCB, eliminating the contact housing and reducing the size of the interconnection as well as increasing the flexibility of contact spacing and placement to improve board routing. This is accomplished, in part, by soldering the individual contacts directly onto the PCB.

Mating PCBs are commonly oriented either parallel to or perpendicular to each other. An electrical interconnect system according to the disclosure includes mounting individual contacts onto one PCB along an edge. The contacts extend over the edge of the PCB in order to make spring contact with surface PCB pads on a second PCB. Because the contacts are individually placed, they are not required to be co-located on the PCB, but can be located along the PCB edge at positions that best suits trace routing and component placement. The contacts may be located at positions that reduce the length of traces leading to the contacts, that simplify trace routing, that reduce trace density, and/or reduce trace congestion around the contacts.

Figure 1:
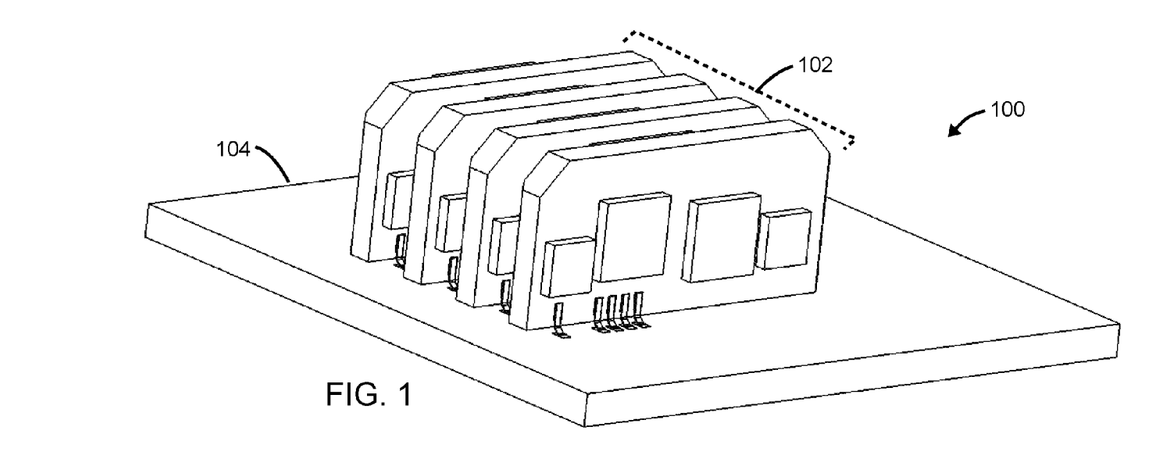
FIG. 1 presents an orthogonal view of an electronic device according to the disclosure.

FIG. 1 presents an orthogonal view of an electronic device 100 according to the disclosure. The electronic device 100 includes a plurality of PCBs 102 that are physically and electronically coupled to a motherboard 104. The PCBs 102 are removably coupled to the motherboard 104 by card edge guides or other mechanical supports that are fixedly coupled to the motherboard 104. The mechanical supports are not shown in the figures, for ease of viewing embodiments of interconnect systems according to the disclosure. The term "electronic assembly" may be used herein to refer to a PCB, a collection of interconnected PCBs, or an electronic device including a collection of interconnected PCBs. The term "PCB" or "circuit board" may be used herein to refer to a printed-circuit board or any other sort of circuit board supporting and interconnecting electronic devices.

Figure 1A:
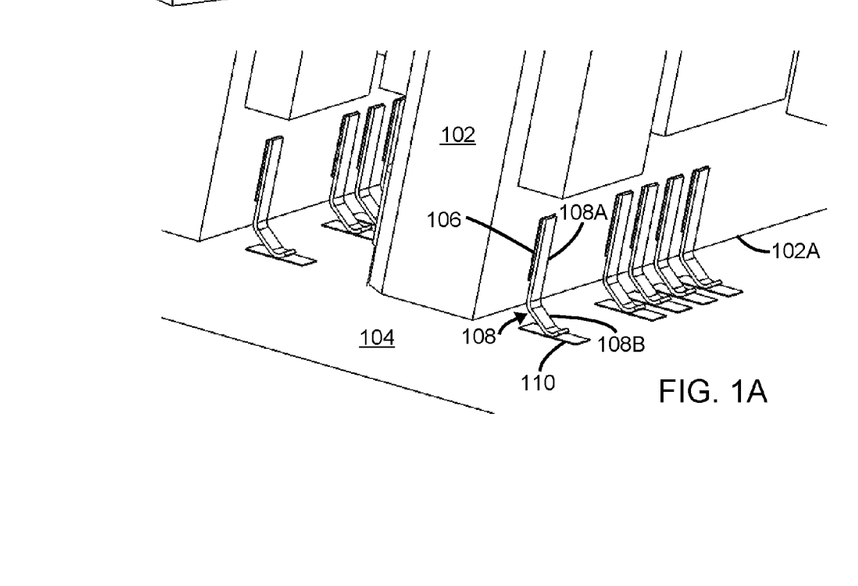
FIG. 1A presents an orthogonal detail view of the embodiment depicted in FIG. 1.

FIG. 1A presents an orthogonal detail view of the embodiment depicted in FIG. 1. The PCB 102 includes a PCB pad 106 adjacent to a lower edge 102A of the PCB 102. A contact 108 according to the disclosure is soldered to the PCB pad 106 along a first portion 108A. The first portion 108A is substantially flat, to provide an extended region for soldering the contact 108 to the PCB pad 106. A second portion 108B extends past the edge 102A and away from the PCB 102 in a direction normal to the PCB pad 106, into a region below and to the right (as shown in FIG. 1 and FIG. 1A) of the PCB 102.

When the PCB 102 is inserted into the card edge guides of the motherboard 104 and moved toward the motherboard 104, the second portion 108B of the contact 108 is pressed into contact with a PCB pad 110 of the motherboard 104.

The contact 108 thus provides an electrical connection between the PCB pad 106 of the PCB 102 and the PCB pad 110 of the motherboard 104.

The second portion 108B of the contact 108 is configured as a leaf spring, such that as a distance between the PCB 102 and the motherboard 104 is reduced, the leaf spring is compressed. A restoring force of the leaf spring acts to maintain electrical contact between the contact 108 and the PCB pad 110. The distance between the PCB 102 and the motherboard 104 may be maintained against the restoring force of the leaf spring by frictional forces between the PCB 102 and the card edge guides, or by a mechanical stop placed above the PCB 102 to prevent its motion away from the motherboard 104.

While the PCB 104 is referred to herein as a motherboard, it will be understood that in other embodiments it may be any suitable circuit board for which electrical interconnection to some or all of the PCBs 102 is desired. While the disclosure describes card edge guides fixedly coupled to the motherboard 104 that receive the PCB 102, it will be understood that in other embodiments other suitable mechanical connection may be provided; for example, a mechanical contact may be fixedly coupled to the PCB 102 and configured to removeably couple to a corresponding mating contact in the motherboard 104.

While FIG. 1 and FIG. 1A depict an embodiment having a single contact located near one end and four other contacts located more centrally on the PCB 102, it will be understood that contacts of an interconnect system according to the disclosure may be located is any desired numbers, configuration, and/or locations along edge 102A and any other edges of the PCB 102 that are adjacent to the PCB 104. The PCB pads 106 and 110 may be located in positions on the PCBs 102 and 104, respectively, that accommodate component placement, trace length and routing, and other constraints of the PCB designers. The placement of PCB pads on the PCBs is not constrained by the need to locate contact headers in adjacent regions of the two PCBs.

While the electrical device 100 includes contacts 108 only along a single edge 102A of the circuit boards 102, it will be understood that in other embodiments additional contacts 108 may be located adjacent to additional edges of the circuit boards 102, such that one or more of the circuit boards 102 are interconnected according to the disclosure to the motherboard 104 and one or more additional common circuit boards.

Figures 2, 2A:
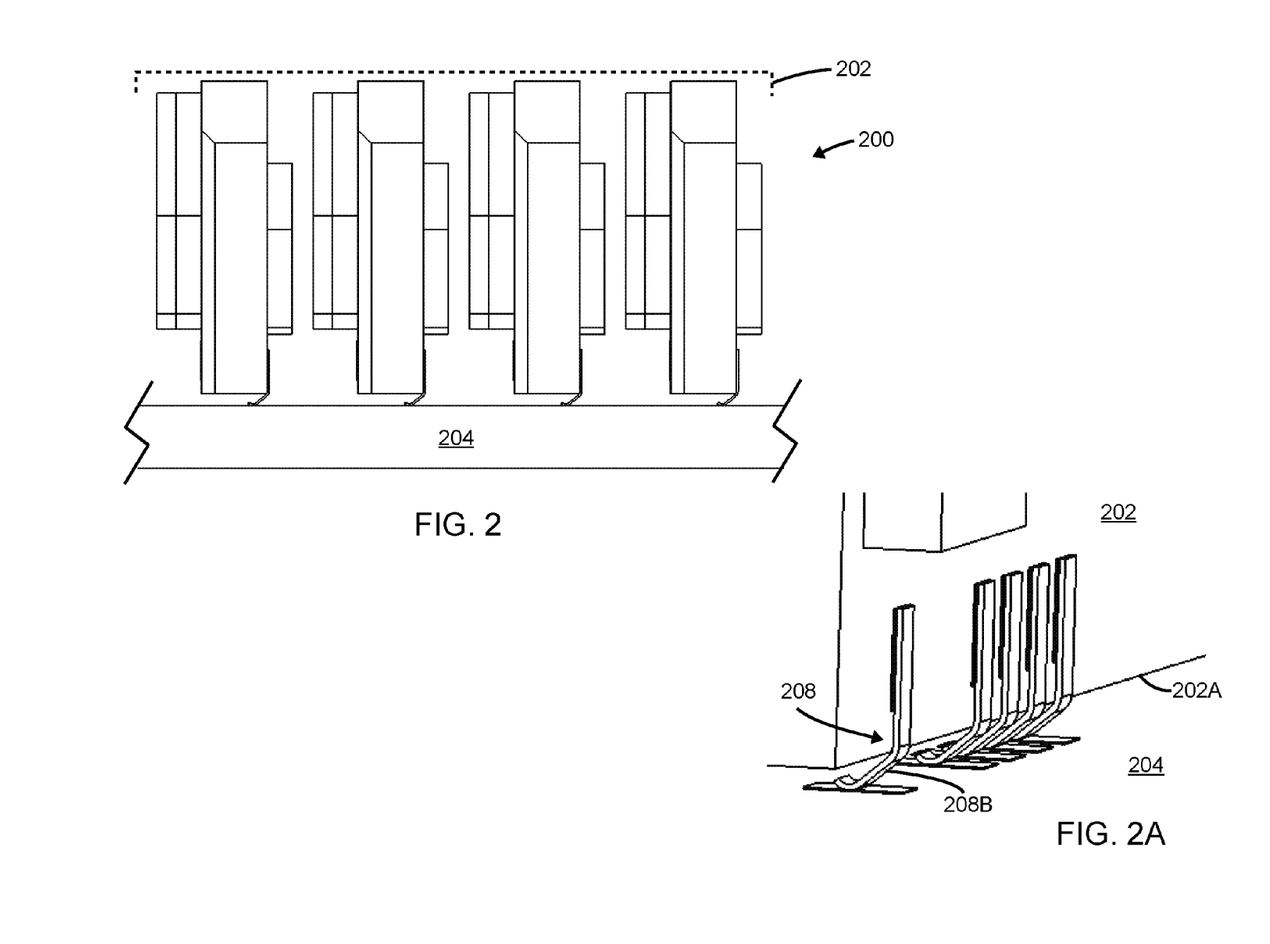
FIG. 2 presents a side view of a second electronic assembly according to the disclosure.
FIG. 2A presents an orthogonal detail view of the embodiment depicted in FIG. 2.

FIG. 2 presents a side view of a second electronic assembly 200 according to the disclosure. The assembly 200 includes a plurality of PCBs 202 that are physically and electronically coupled to a motherboard 204. As for the embodiment shown and described with reference to FIG. 1, the PCBs 202 are removably coupled to the motherboard 204 by card edge guides or other mechanical supports not shown in the figures.

FIG. 2A presents an orthogonal detail view of the embodiment depicted in FIG. 2. A first portion of a contact 208 is soldered to a PCB pad of the PCB 202. A second portion 208B of the contact 208 extends past an edge 202A of the PCB 202, and curves under the PCB 202, along a side of the PCB 202 adjacent to the PCB 204. When the PCB 202 is inserted into the card edge guides of the motherboard 204 and moved toward the motherboard 204, the second portion 208B of the contact 208 is pressed into contact with a PCB pad of the motherboard 204 and provides an electrical connection between the PCB 202 and the motherboard 204.

As with the contact 108 shown and described with reference to FIG. 1, the second portion 208B of the contact 208 is configured as a leaf spring, which is compressed as a distance between the PCB 202 and the motherboard 204 is reduced. Because the second portion 208B of the contact 208 curves under the PCB 202, the contact 208 does not increase any horizontal 'footprint' of the PCB 202, as the contact 108 might do.

Figures 3, 4:
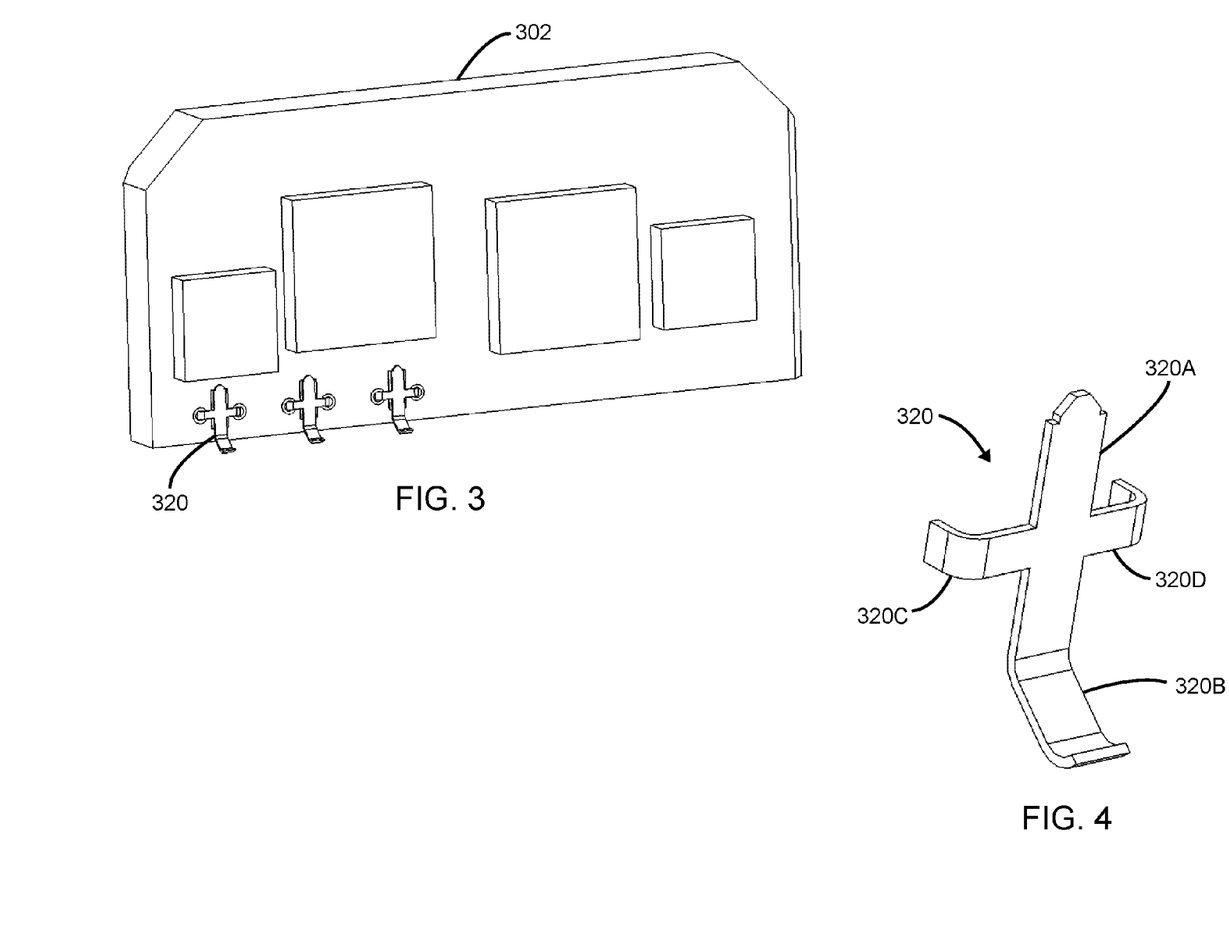
FIG. 3 presents an orthogonal view of a third electronic assembly according to the disclosure.
FIG. 4 presents an orthogonal view of a contact according to the disclosure.

FIG. 3 presents an orthogonal view of an electronic assembly 302 according to the disclosure. In this embodiment, the electronic assembly 302 is a PCB. The PCB 302 includes a contact 320, which is also shown in FIG. 4. The contact 320 includes first portion 320A and second portion 320B as shown and described with reference to contact 108 of FIGS. 1 and 1A and contact 208 of FIGS. 2 and 2A. The contact 320 further includes tabs 320C and 320D, which are coupled to holes in the PCB 302 to provide stress relief for the contact 320 while in use.

The tabs 320C and 320D are preferably soldered into the holes in the PCB 302, but may be fixedly coupled by any other suitable coupling technique or mechanism. In some embodiments, the tabs 320C and 320D are coplanar with the first portion 320A and are soldered to one or more PCB pads on the PCB 302. When the PCB 302 is brought into contact with another PCB, compressing the leaf spring second portion 320B of the contact 320, the force compressing the spring is transferred to the first portion 320A as a torsion force tending to pull the lower part of the portion 320A away from the PCB 302. The tabs 320C and 320D, fixedly coupled to the PCB 302, act against the torsion force, providing strain relief to resist the contact 320 being separated from the PCB 302.

While the contact 320 includes two tabs 320C and 320D configured to couple to the PCB 302 to provide strain relief, in other embodiments contacts according to the disclosure may be provided with one strain relief tab, or with more than two strain relief tabs. In still other embodiments, the strain relief tabs 320C and 320D may be fixedly coupled to the PCB 302 by some other suitable mechanical coupling technique.

Figure 5:
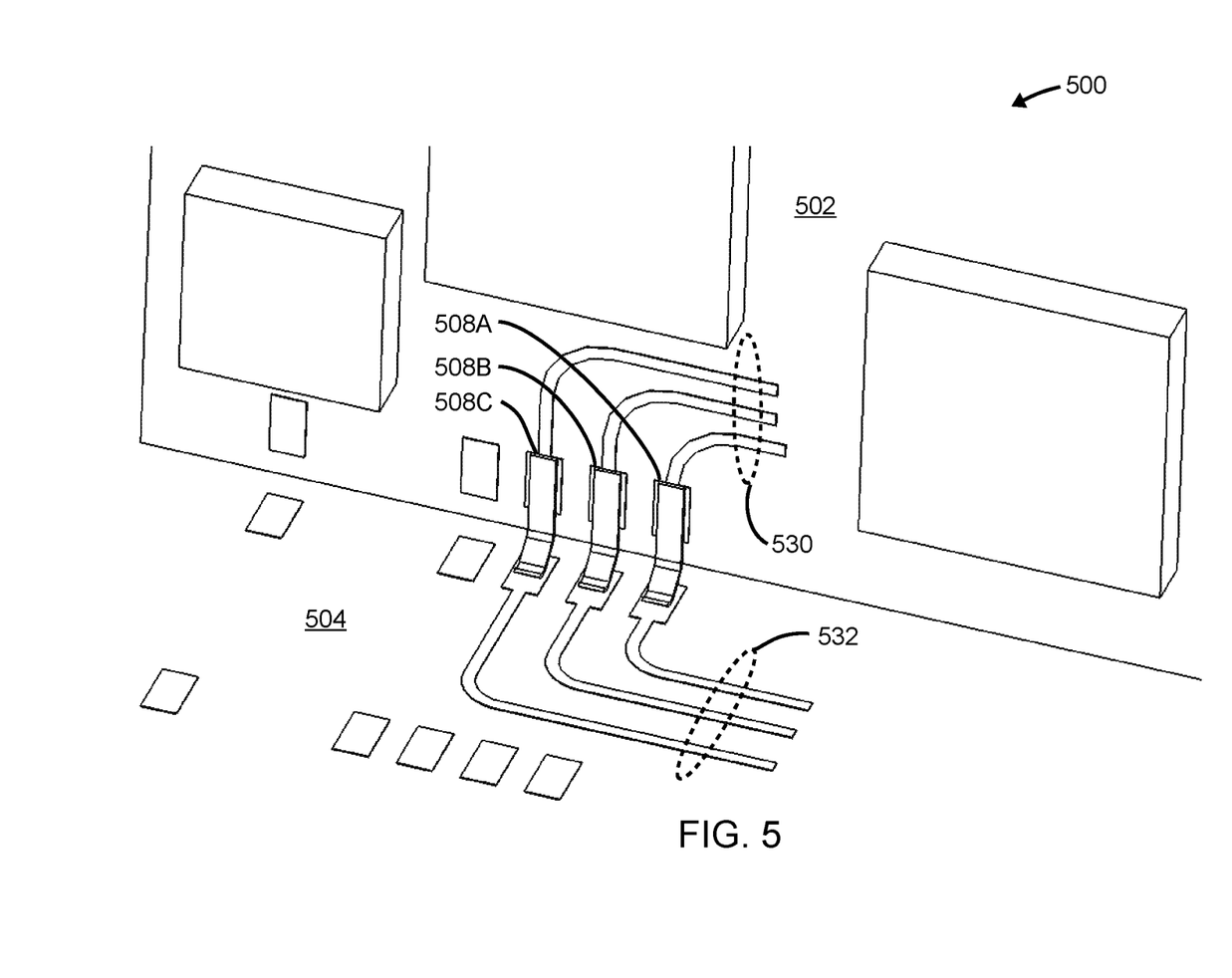
FIG. 5 presents an orthogonal view of a fourth electronic assembly according to the disclosure.

FIG. 5 presents an orthogonal view of a fourth electronic assembly 502 according to the disclosure. The electronic assembly 500 includes a PCB 502 and a motherboard 504. The PCB 502 includes traces 530 forming a coplanar waveguide for conducting radio-frequency or other high-frequency signals. Similarly, the motherboard 504 includes traces 532 forming a coplanar waveguide. Contacts 508A, 508B, and 508C according to the disclosure are arranged as a coplanar waveguide to electrically couple PCB pads of the waveguide 530 traces to PCB pads of the waveguide 532 traces.

Figure 6:
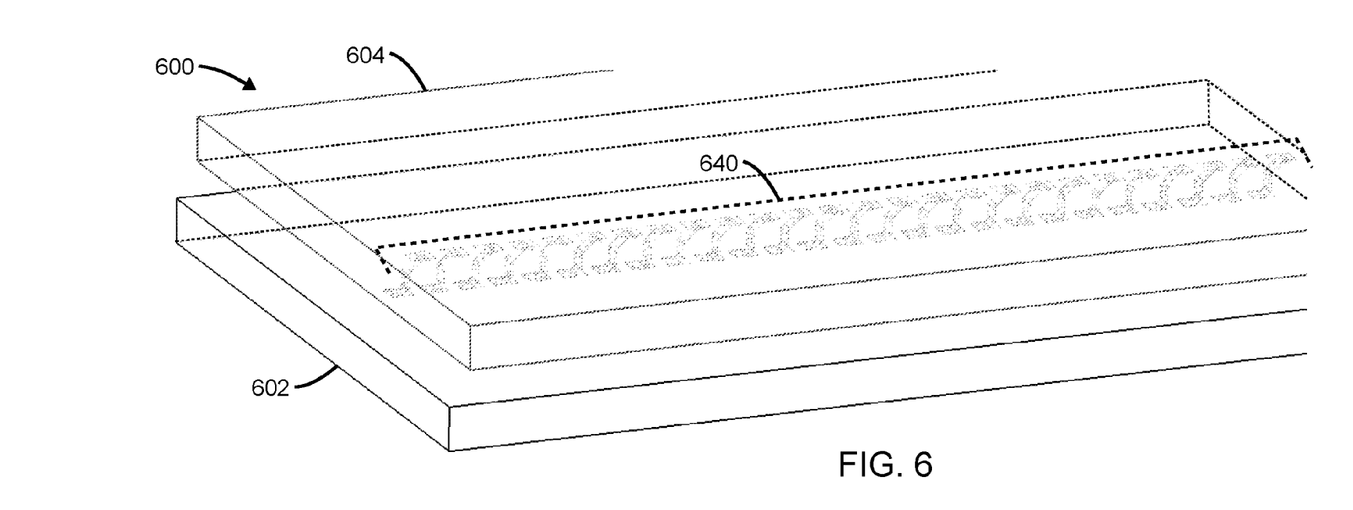
FIG. 6 presents an orthogonal view of a fifth electronic assembly according to the disclosure.

FIG. 6 presents an orthogonal view of a fifth electronic assembly 600 according to the disclosure. The assembly 600 includes a first PCB 602, a second PCB 604, and a plurality of contacts 640 configured to electrically couple PCB pads on the PCB 602 to PCB pads on the PCB 604. While the contacts 640 are shown in this embodiment in a linear formation with a regular pitch, it will be understood that in other embodiments the contacts 640 may be arranged in arbitrary locations that allow PCB designers to simplify trace routing and minimize trace lengths and density on the PCBs.

Figure 6A:
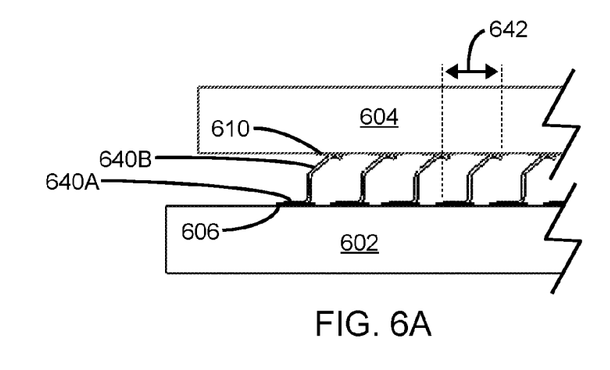
FIG. 6A presents a side detail view of the embodiment depicted in FIG. 6.

FIG. 6A presents a side detail view of the embodiment depicted in FIG. 6. The contact 640 includes a first portion 640A that is soldered to a PCB pad 606 that is substantially coplanar with an upper surface of the PCB 602. The contact further includes a second portion 640B, fashioned as a leaf spring and extending away from the surface of the PCB 602. During the process of assembling the electronic assembly 600, the PCB 604 is brought into proximity of and coupled to the PCB 602, with a standoff (not shown) establishing a minimum separation between the PCBs. In this assembled configuration, the second portion 640B of the contact 640 is pressed into contact with a PCB pad 610 of the PCB 604, compressing the leaf spring of the second portion 640B. The PCB pad 610 of the PCB 604 is substantially coplanar with a lower surface of the PCB 604. A restoring force of the leaf spring of the second portion 640B acts to maintain electrical contact between the contact 640 and the PCB pad 610. The contact 640 thus provides an electrical connection between the PCB pad 606 and the PCB pad 610.

Because the second portion 640B of the contact 640 is raised above the surface of the PCB 602, spacing between the contact 640 and a second contact according to the disclosure may be reduced by locating a second PCB pad 606 and associated first portion 640A of a second contact 640 under the second portion 640B of the first contact 640. This close spacing may be seen in the embodiment shown in FIGS. 6 and 6A. As such, the contacts 640 may be spaced together at a pitch that is less than a length 642 of an individual contact 640.

In other embodiments, three contacts 640 may be located adjacent to each other to form a coplanar waveguide, as shown and described with reference to FIG. 5. In still other embodiments, one or both of the circuit boards 602 and 604 may include contacts according to the disclosure as shown and described with reference to any of FIGS. 1-5 to provide electrical interconnection to one or more additional circuit boards (not shown in FIG. 6).

Figures 7, 7A:
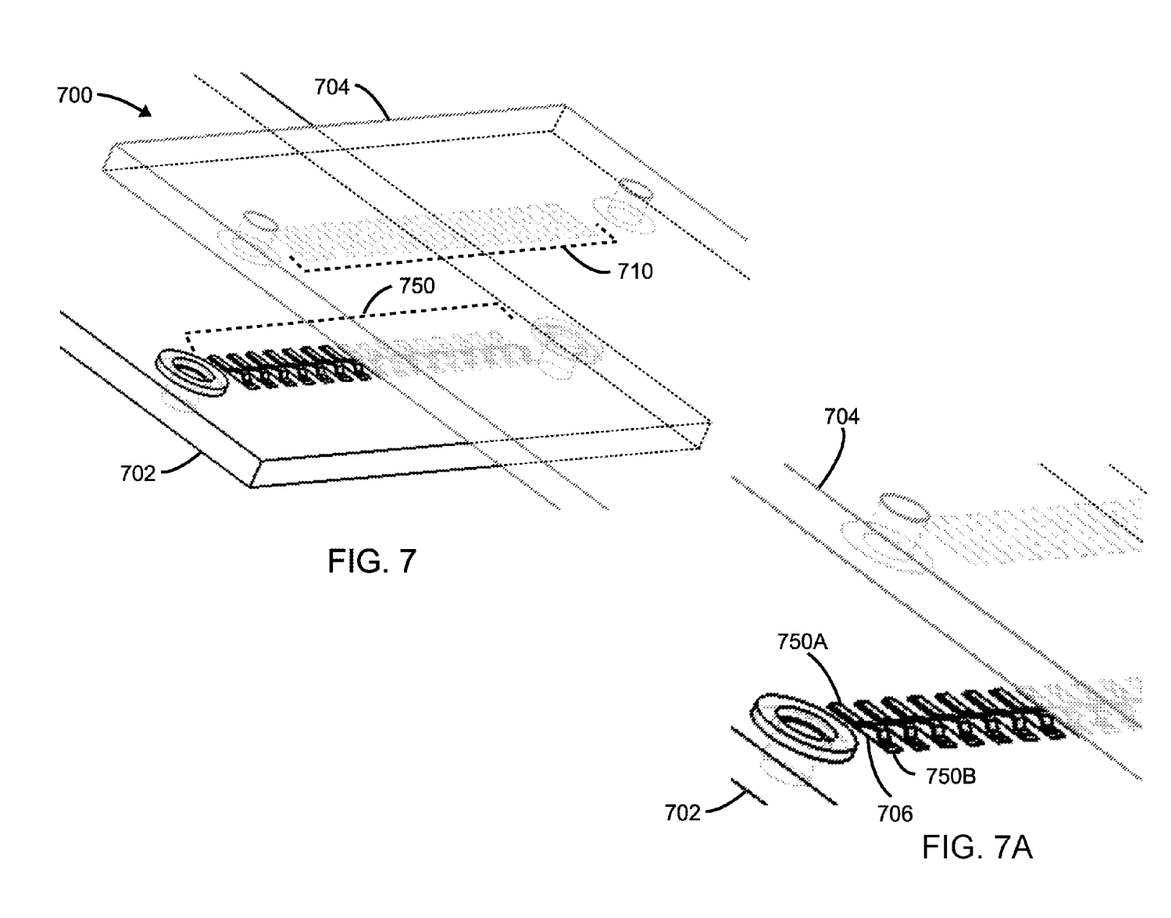
FIG. 7 presents an orthogonal view of a sixth electronic assembly according to the disclosure.
FIG. 7A presents an orthogonal detail view of the embodiment depicted in FIG. 7.

FIG. 7 presents an orthogonal view of a sixth electronic assembly 700 according to the disclosure. The assembly 700 includes a first PCB 702, a second PCB 704, and a plurality of contacts 750 configured to electrically couple PCB pads on the PCB 702 to PCB pads on the PCB 704. While the contacts 750 are shown in this embodiment in a linear formation with a regular pitch, it will be understood that in other embodiments the contacts 750 may be arranged in arbitrary locations that allow PCB designers to simplify trace routing and minimize trace lengths and density on the PCBs.

FIG. 7A presents a side detail view of the embodiment depicted in FIG. 7. The contact 750 includes a first portion 750A that is soldered to a PCB pad 706 that is substantially coplanar with an upper surface of the PCB 702. The contact further includes a second portion 750B, fashioned as a leaf spring and extending away from and back towards the surface of the PCB 702. During the process of assembling the electronic assembly 700, the PCB 704 is brought into proximity of and coupled to the PCB 702, with a standoff (not shown) establishing a minimum separation between the PCBs. In this assembled configuration, the second portion 750B of the contact 750 is pressed into contact with a PCB pad 710 of the PCB 704, compressing the leaf spring of the second portion 750B. The PCB pad 710 of the PCB 704 is substantially coplanar with a lower surface of the PCB 704. A restoring force of the leaf spring of the second portion 740B acts to maintain electrical contact between the contact 740 and the PCB pad 710. The contact 750 thus provides an electrical connection between the PCB pad 706 of the PCB 702 and the PCB pad 710 of the PCB 704.

Contacts of the type shown in FIGS. 1-5 may be referred to as 'edge contacts,' while contacts of the type shown in FIGS. 6-7A may be referred to as 'lap joint contacts.'

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic assembly, comprising:
 a first circuit board, comprising a plurality of PCB pads located adjacent to one or more edges of the first circuit board; and
 a corresponding plurality of contacts, each contact soldered to one of the plurality of PCB pads of the first circuit board, wherein
  each contact comprises a first portion soldered to the associated PCB pad of the first circuit board and a second portion extending away from the first circuit board in a direction past the adjacent edge of the circuit board to form a leaf spring configured to compress in a space between the edge of the first circuit board and an external surface of a second circuit board when the second portion of the contact is placed in contact with a PCB pad of the second circuit board, the PCB pad of the second circuit board substantially coplanar with the external surface of the second circuit board, and
  a restoring force of the second portion configured to maintain contact between the second portion and the PCB pad of the second circuit board, the contact forming an electrical connection between the PCB pad of the first circuit board and the PCB pad of the second circuit board.

2. The electronic assembly of claim 1, wherein each of the plurality of PCB pads of the first circuit board is substantially coplanar with the external surface of the first circuit board: and where the second portion of each contact extends outwardly away from the edge of the first circuit board at an angle deviating from a plane of the first circuit board in a direction toward the external surface of the second circuit board when the second portion of the contact is placed in contact with the PCB pad of the second circuit board.

3. The electronic assembly of claim 1, wherein the second portion of the contact extends past the edge of the first printed circuit board and curves under the first circuit board along a side of the first circuit board that is adjacent to the second circuit board when the second portion of the contact is placed in contact with the PCB pad of the second circuit board.

4. The electronic assembly of claim 1, wherein the contact further comprises a third portion configured to fixedly couple to the first circuit board and provide strain relief to resist forces exerted by the compressed leaf spring to separate the first portion of the contact from the associated PCB pad of the first circuit board; where the third portion comprises at least one tab that is fixedly coupled to a hole defined in the first circuit board.

5. The electronic assembly of claim 1, wherein the first circuit board comprises a coplanar waveguide formed by PCB traces coupled to the plurality of PCB pads of the first circuit board; wherein the second circuit board comprises a coplanar waveguide formed by PCB traces coupled to a plurality of PCB pads of the second circuit board; and where the plurality of contacts is arranged as a coplanar waveguide to electrically couple the plurality of PCB pads of the first circuit board to the plurality of PCB pads of the second circuit board.

6. The electronic assembly of claim 5, wherein the plurality of contacts is arranged as a coplanar waveguide configured to conduct radio-frequency signals between the coplanar waveguide of the first printed circuit board and the coplanar waveguide of the second printed circuit board.

7. The electronic assembly of claim 1, wherein the plurality of PCB pads are arranged in arbitrary locations that minimize trace lengths on one or both of the first and second circuit boards.

8. An electronic device, comprising:
a plurality of circuit boards, each circuit board comprising a plurality of PCB pads located adjacent to one or more edges of the circuit board and a corresponding plurality of contacts, each contact soldered to one of the plurality of PCB pads of the circuit board; and
a motherboard, configured to connect electrically to the plurality of circuit boards,
wherein
each contact comprises a first portion contacting and soldered to the associated PCB pad of the associated circuit board and a second portion extending away from the associated circuit board in a direction past the adjacent edge of the associated circuit board and form a leaf spring configured to compress in a space between the edge of the associated circuit board and an external surface of the motherboard when the second portion of the contact is placed in contact with a PCB pad of the motherboard, the PCB pad of the motherboard substantially coplanar with the external surface of the motherboard, and
a restoring force of the second portion configured to maintain contact between the second portion and the PCB pad of the motherboard, the contact forming an electrical connection between the PCB pad of the associated circuit board and the PCB pad of the motherboard.

9. The electronic device of claim 8, wherein each of the plurality of PCB pads of the plurality of circuit boards is substantially coplanar with an external surface of the associated circuit board: and where the second portion of one or more of the contacts extends outwardly away from the edge of the associated circuit board at an angle deviating from a plane of the first circuit board in a direction toward the external surface of the motherboard when the second portion of the contact is placed in contact with the PCB pad of the motherboard.

10. The electronic device of claim 8, wherein the second portion of one or more of the contacts extends along a side of the associated circuit board that is adjacent to the motherboard.

11. The electronic device of claim 8, wherein the contact further comprises a third portion configured to fixedly couple to the associated circuit board and provide strain relief to resist forces exerted by the compressed leaf spring to separate the first portion of the contact from the associated PCB pad of the associated circuit board; where the third portion comprises at least one tab that is fixedly coupled to a hole defined in the associated circuit board.

12. The electronic device of claim 8, where one or more of the plurality off circuit boards comprises a coplanar waveguide formed by PCB traces coupled to the plurality of PCB pads of the associated circuit board; wherein the motherboard comprises a coplanar waveguide formed by PCB traces coupled to a plurality of PCB pads of the motherboard; and where the plurality of contacts is arranged as a coplanar waveguide to electrically couple the plurality of PCB pads of the associated circuit board to the plurality of PCB pads of the motherboard.

13. The electronic device of claim 8, further comprising a common circuit board, wherein:

at least one of the plurality of circuit boards further comprises an additional PCB pad located adjacent to a second edge of the at least one circuit board and an additional contact soldered to the additional PCB pad,
wherein
the additional contact comprises a first portion soldered to the additional PCB pad and a second portion extending away from the at least one circuit board in a direction past the second edge of the at least one circuit board and form a leaf spring configured to compress in a space between the second edge of the at least one circuit board and an external surface of the common circuit board when the second portion of the additional contact is placed in contact with a PCB pad of the common circuit board, the PCB pad of the common circuit board substantially coplanar with an external surface of the common circuit board, and
a restoring force of the second portion configured to maintain contact between the second portion and the PCB pad of the common circuit board, the contact forming an electrical connection between the additional PCB pad and the PCB pad of the common circuit board.

14. An electronic assembly, comprising:
a first circuit board, comprising a plurality of PCB pads coplanar with an external surface of the first circuit board; and
a corresponding plurality of contacts, each contact soldered to one of the plurality of PCB pads of the first circuit board, wherein
each contact comprises a first portion soldered to the associated PCB pad of the first circuit board and a second portion extending outwardly away from the first circuit board in a direction outward from the associated PCB pad and toward an external surface of a second circuit board when the second portion of the contact is placed in contact with the PCB pad of the second circuit board and form a leaf spring configured to compress in a space between the external surface of the first circuit board and the external surface of the second circuit board when the second portion of the contact is placed in contact with a PCB pad of the second circuit board, the PCB pad of the second circuit board substantially coplanar with the external surface of the second circuit board, and
a restoring force of the second portion configured to maintain contact between the second portion and the PCB pad of the second circuit board, the contact forming an electrical connection between the PCB pad of the first circuit board and the PCB pad of the second circuit board; and where at least one of:
the second portion of each contact is configured to form a leaf spring with a shape that extends away from and then back towards the external surface of the first circuit board, or
wherein a first PCB pad is soldered to first portion of a first contact, the first PCB pad being located under a second portion of a second contact, and the second contact having a first portion soldered to a second PCB pad.

15. The electronic assembly of claim 14, wherein a first PCB pad is soldered to first portion of a first contact, the first PCB pad being located under a second portion of a second contact, and the second contact having a first portion soldered to a second PCB pad.

16. The electronic assembly of claim 15, where each of the first contact and second contact has a length projected on the plane of the first printed circuit board that is defined between a first end of the respective contact adjacent the first portion of the contact and an opposite end of the contact adjacent the second portion of the respective contact; and where the first and second contacts are spaced together on the first printed circuit board at a pitch that is less than the projected length of each of the first and second contacts projected on the first printed circuit board.

17. The electronic assembly of claim 14, wherein the first circuit board comprises a coplanar waveguide formed by PCB traces coupled to the plurality of PCB pads of the first circuit board; wherein the second circuit board comprises a coplanar waveguide formed by PCB traces coupled to a plurality of PCB pads of the second circuit board; and where the plurality of contacts is arranged as a coplanar waveguide.

18. The electronic assembly of claim 14, wherein the plurality of PCB pads are arranged in arbitrary locations that minimize trace lengths on one or both of the first and second circuit boards.

19. The electronic assembly of claim 14, where the second portion of each contact is configured to form a leaf spring that extends away from and back towards the surface of the first circuit board.

20. The electronic assembly of claim 14, where the second portion of each contact extends outwardly away from the first circuit board in a direction normal to the associated PCB pad and toward the external surface of a second circuit board when the second portion of the contact is placed in contact with the PCB pad of the second circuit board.

21. The electronic assembly of claim 14, where the first circuit board and the second circuit board are disposed in adjacent parallel relationship with the second portion of the contact contacting the PCB pad of the second circuit board and forming a leaf spring compressed in a space between the external surface of the first circuit board and the external surface of the second circuit board.

22. An electronic device, comprising:
a first circuit board, comprising
  a first plurality of PCB pads and a corresponding plurality of lap joint contacts, each lap joint contact soldered to an associated PCB pad of the first plurality of PCB pads, and
  a second plurality of PCB pads located adjacent to an edge of the first circuit board and a corresponding plurality of edge contacts, each edge contact soldered to an associated PCB pad of the second plurality of PCB pads;
a second circuit board, comprising a third plurality of PCB pads; and
a motherboard, comprising a fourth plurality of PCB pads, wherein
  each lap joint contact comprises a first portion configured to contact and be soldered to the associated PCB pad of the first plurality of PCB pads and a second portion configured to extend away from the first circuit board in a direction normal to the associated PCB pad and form a leaf spring configured to compress when placed in contact with a PCB pad of the third plurality of PCB pads, the PCB pad of the third plurality of PCB pads substantially coplanar with a surface of the second circuit board, and
  a restoring force of the second portion of the lap joint contacts configured to maintain contact between the second portion and the PCB pad of the third plurality of PCB pads, the lap joint contact forming an electrical connection between the PCB pad of the first plurality of PCB pads and the PCB pad of the third plurality of PCB pads,
  each edge contact comprises a first portion configured to contact and be soldered to the associated PCB pad of the second plurality of PCB pads and a second portion configured to extend past the adjacent edge of the first circuit board and form a leaf spring configured to compress when placed in contact with a PCB pad of the fourth plurality of PCB pads, the PCB pad of the fourth plurality of PCB pads substantially coplanar with a surface of the motherboard, and
  a restoring force of the second portion configured to maintain contact between the second portion and the PCB pad of the fourth plurality of PCB pads, the contact forming an electrical connection between the PCB pad of the second plurality of PCB pads and the PCB pad of the fourth plurality of PCB pads.

23. The electronic device of claim 22, wherein the second portion of one or more of the edge contacts extends away from the first circuit board in a direction normal to the associated PCB pad of the second plurality of PCB pads.

24. The electronic device of claim 22, wherein the second portion of one or more of the edge contacts extends under the first circuit board and along a side of the first circuit board that is adjacent to the motherboard.

25. The electronic device of claim 22, wherein the edge contact further comprises a third portion configured to fixedly couple to the first circuit board and provide strain relief to resist forces exerted by the compressed leaf spring to separate the first portion of the edge contact from the associated PCB pad of the second plurality of PCB pads.

* * * * *